US008284704B2

(12) United States Patent
Rofougaran et al.

(10) Patent No.: US 8,284,704 B2
(45) Date of Patent: Oct. 9, 2012

(54) METHOD AND SYSTEM FOR UTILIZING UNDERSAMPLING FOR CRYSTAL LEAKAGE CANCELLATION

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1341 days.

(21) Appl. No.: 11/864,734

(22) Filed: Sep. 28, 2007

(65) Prior Publication Data

US 2009/0086703 A1  Apr. 2, 2009

(51) Int. Cl.
*H04B 7/00* (2006.01)
(52) U.S. Cl. .................................................. 370/310
(58) Field of Classification Search .................. None
See application file for complete search history.

(56) References Cited

U.S. PATENT DOCUMENTS

| | | | | |
|---|---|---|---|---|
| 4,078,156 A * | 3/1978 | Langan | ...... | 370/532 |
| 4,887,050 A * | 12/1989 | Borth et al. | ...... | 331/34 |
| 5,943,363 A * | 8/1999 | Hanson et al. | ...... | 375/150 |
| 5,969,667 A * | 10/1999 | Farmer et al. | ...... | 342/165 |
| 6,002,599 A * | 12/1999 | Chow | ...... | 363/59 |
| 6,314,278 B1 * | 11/2001 | Zamat | ...... | 455/239.1 |
| 6,603,754 B1 * | 8/2003 | Park | ...... | 370/342 |
| 6,839,334 B1 * | 1/2005 | Krishnamoorthy et al. | ...... | 370/335 |
| 6,989,685 B1 * | 1/2006 | Andersen et al. | ...... | 324/750.05 |
| 6,993,091 B2 * | 1/2006 | Ratto | ...... | 375/297 |
| 7,116,729 B2 * | 10/2006 | Ibrahim et al. | ...... | 375/324 |
| 7,599,662 B2 * | 10/2009 | Ibrahim et al. | ...... | 455/41.2 |
| 7,623,826 B2 * | 11/2009 | Pergal | ...... | 455/11.1 |
| 2002/0176522 A1 * | 11/2002 | Fan | ...... | 375/340 |
| 2004/0087313 A1 * | 5/2004 | Reid | ...... | 455/455 |
| 2005/0197064 A1 * | 9/2005 | Ibrahim et al. | ...... | 455/41.2 |
| 2007/0171731 A1 * | 7/2007 | Ford et al. | ...... | 365/189.01 |
| 2007/0242599 A1 * | 10/2007 | Gorday et al. | ...... | 370/208 |
| 2008/0279090 A1 * | 11/2008 | Liu et al. | ...... | 370/210 |
| 2009/0041161 A1 * | 2/2009 | Jian et al. | ...... | 375/319 |

* cited by examiner

*Primary Examiner* — Chi Pham
*Assistant Examiner* — Fan Ng
(74) *Attorney, Agent, or Firm* — Farjami & Farjami LLP

(57) ABSTRACT

Methods and systems for utilizing undersampling for crystal leakage cancellation are disclosed and may include undersampling a composite signal comprising a desired signal and leakage signals due to one or more clock signals. Measured DC signals generated by each of the undersampled signals may be reduced by adjusting the phase and/or amplitude of the clock signals. The undersampling may be performed at one or more of the one or more clock signals, or at integer sub-harmonics of the clock signals. The composite signal may include a signal received by a wireless system or a signal to be transmitted by the wireless system. The undersampled signals may be low-pass filtered. The desired signal may include in-phase and quadrature signals or a polar signal. The undersampling may be performed by one or more sample and hold circuits and the clock signals may be generated utilizing one or more crystal oscillators.

20 Claims, 6 Drawing Sheets

METHOD AND SYSTEM FOR UTILIZING UNDERSAMPLING FOR CRYSTAL LEAKAGE CANCELLATION

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for utilizing undersampling for crystal leakage cancellation.

BACKGROUND OF THE INVENTION

In 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, not least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for utilizing undersampling for crystal leakage cancellation, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for utilizing undersampling for crystal leakage cancellation. Exemplary aspects of the invention may comprise undersampling a composite signal comprising a desired signal and one or more leakage signals due to one or more clock signals. One or more measured DC signals generated by each of the undersampled signals may be reduced by adjusting a phase and/or an amplitude of the one or more clock signals. The undersampling may be performed at one or more of the clock signals, or at integer sub-harmonics of the clock signals. The composite signal may comprise a signal received by a wireless system or a signal to be transmitted by the wireless system. The undersampled signals may be low-pass filtered. The desired signal may comprise in-phase and quadrature signals or a polar signal. The undersampling may be performed by one or more sample and hold circuits and the clock signals may be generated utilizing one or more crystal oscillators.

Figure 1:
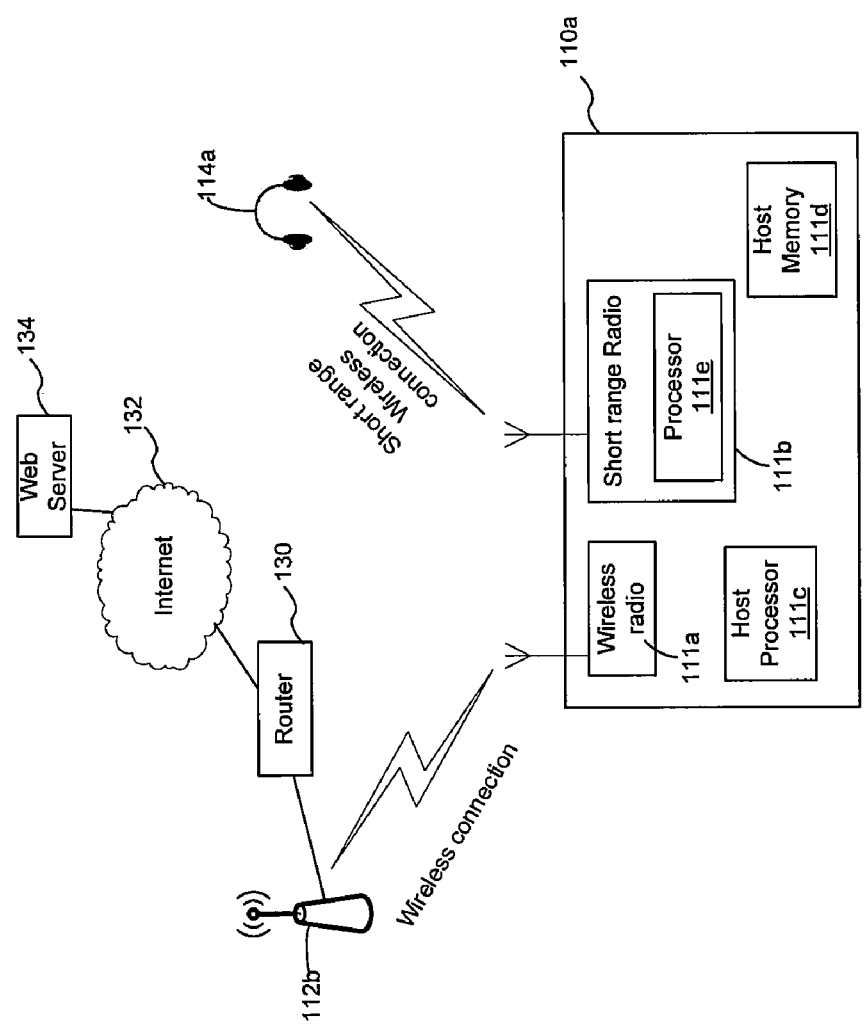
FIG. 1 is a diagram illustrating an exemplary wireless communication system, in connection with an embodiment of the invention.

FIG. 1 is a diagram illustrating an exemplary wireless communication system, in accordance with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, a host memory 111d and a processor 111e. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134.

Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a. The processor 111e may control signal processing, clock signals and delays, for example, in the short range radio 111b.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Undersampling may be utilized to remove leakage from clock signals in 60 GHz wireless systems. Leakage signals may be reduced and/or eliminated by configuring the clock signal for an undersampling process to be an integer sub-harmonic frequency of the clock signal that may be leaking into the desired output signal.

Figure 2:
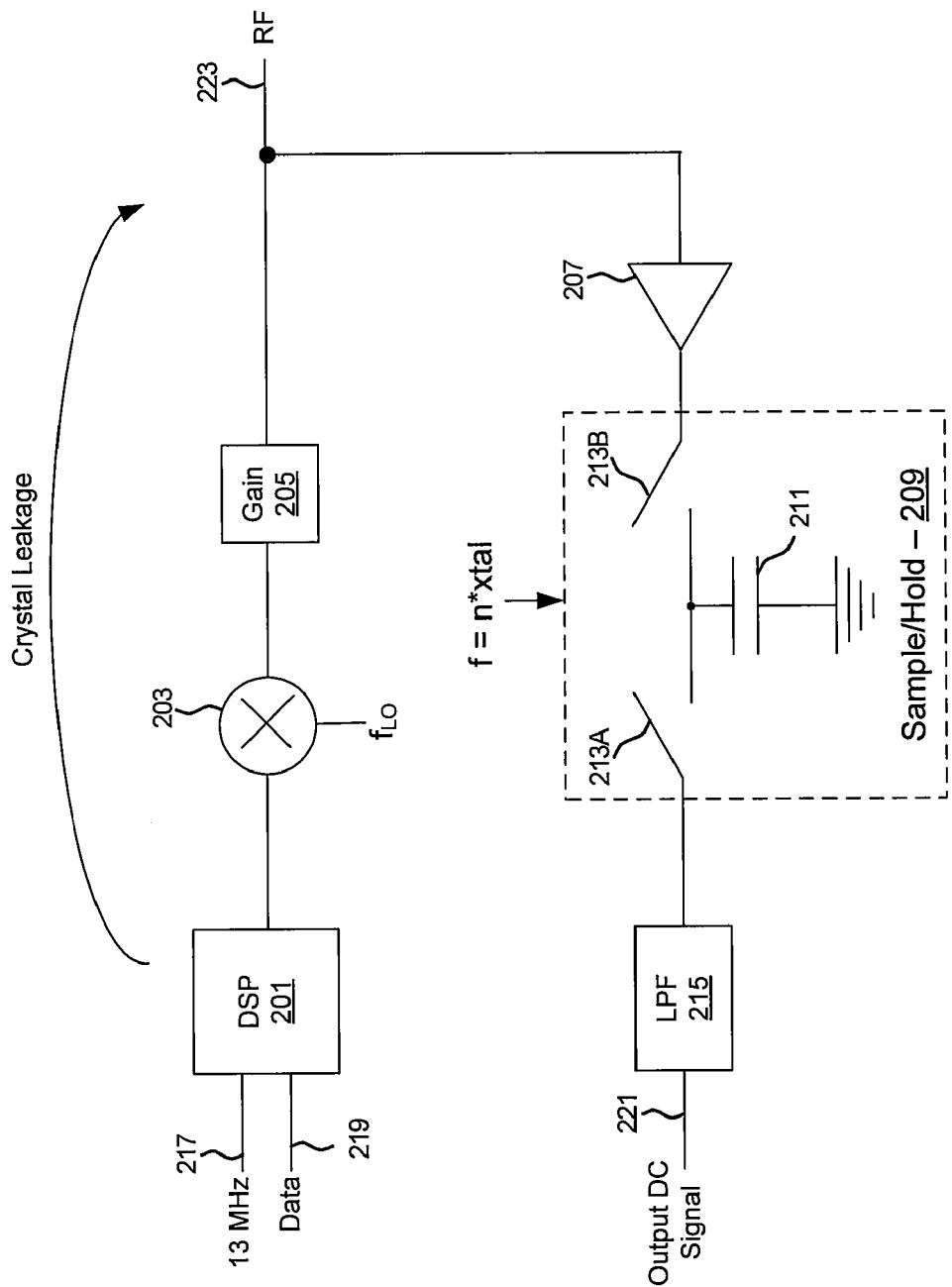
FIG. 2 is a block diagram illustrating an exemplary crystal leakage cancellation system, in accordance with an embodiment of the invention.

FIG. 2 is a block diagram illustrating an exemplary crystal leakage cancellation system, in accordance with an embodiment of the invention. Referring to FIG. 2, there is shown a digital signal processor (DSP) 201, a mixer 203, amplifiers 205 and 207, a sample and hold (S/H) circuit 209, and a low pass filter (LPF) 215. There is also shown a crystal signal 217, a data signal 219, a DC output signal 221 and an RF signal 223. The S/H circuit 209 may comprise a capacitor 211 and switches 213A and 213B.

The DSP 201 may comprise suitable circuitry, logic and/or code that may enable processing of baseband signals that may be up-converted and transmitted by an antenna, for example, not shown in FIG. 2, or received by an antenna and down-converted. For transmission, the DSP 201 may receive as inputs a 13 MHz crystal signal 217 and the data signal 219. For reception, the DSP 201 may generate the data signal 219 as an output. The crystal signal 217 may comprise a clock signal for the DSP 201 and/or other devices in the wireless system. Clock signals may "leak" from baseband circuitry into subsequent stages of a wireless system, as described further with respect to FIG. 3. The DSP 201 may be enabled to generate in-phase and quadrature (I and Q) signals or polar signals for up-conversion, amplification and transmission. Alternatively, the DSP 201 may be enabled to process I and Q and/or polar signals from down-converted received signals. Leakage signals may be present in received signals via spurious clock signals received by an antenna, for example.

The mixer 203 may comprise suitable circuitry, logic and/or code that may enable up-converting a received baseband signal utilizing an input local oscillator (LO) signal, indicated by $f_{LO}$ in FIG. 2. The resulting output signal may be an RF signal suitable for amplification and transmission. In another embodiment of the invention, the mixer 203 may be enabled to down-convert a received signal.

The amplifier 205 may comprise suitable circuitry, logic and/or code that may enable amplifying the signal generated by the mixer 203 for transmission. In another embodiment of the invention, the amplifier may be enabled to amplify a signal received by an antenna, for example. The gain of the amplifier 205 may be variable, and the amplified signal may comprise the RF output signal 223. The RF signal 223 may be suitable for further amplification before transmission via an antenna, for example. In another embodiment of the invention, the RF signal 223 may comprise a received RF signal.

The amplifier 207 may comprise suitable circuitry, logic and/or code that may enable further amplification of the RF signal 223 prior to subsampling by the S/H circuit 209. The S/H circuit 209 may comprise suitable circuitry, logic and/or code that may enable sampling the signal received from the amplifier 207. The switches 213A and 213B may be enabled to open and close at a sampling frequency, which may be the same as or an integer sub-harmonic of the crystal signal 217. The capacitor 211 may enable the holding of a sampled signal before communicating it to the LPF 215.

The LPF 215 may comprise suitable circuitry, logic and/or code that may enable filtering signals at frequencies higher than a cutoff frequency. The LPF 215 cutoff frequency may be configured to filter signals except those at or near DC.

In operation, the DSP 201 may generate baseband signals to be up-converted and amplified such that they may be transmitted to the wireless medium. A clock signal, such as the crystal signal 217, may leak from the DSP 201 through the mixer 203 and the amplifier 205 into the RF signal 223. By undersampling the RF signal 223 at an integer sub-harmonic of the crystal signal 217 in the S/H circuit 209, the harmonics of the crystal signal 217 may be "folded" down to DC, such that the DC voltage measured at the output of the LPF 215 may indicate the amount of leakage of the crystal signal 217 into the RF signal 223. By adjusting the phase and amplitude of the crystal signal 217 at the input of the DSP 201, a minimum in the DC voltage may be obtained at the output of the LPF 221. In this manner, the leakage of the crystal signal 217 into the RF signal 223 may be minimized and/or eliminated.

The sampling frequency for the S/H 209 may be generated utilizing the crystal signal 217 and dividing the frequency by an integer. In this manner, the harmonics of the crystal frequency that may be leaking into other sections of the wireless system may be at DC due to undersampling.

The invention is not limited in the frequency of the crystal signal 217, 13 MHz, for example, or in the number of clock signals. Accordingly, any desired frequency and the leakage from any number of clock signals may be reduced and/or eliminated by utilizing a plurality of S/H circuits and low pass filters. Each S/H circuit may sample at a frequency that may be equal to or an integer sub-harmonic of the particular clock signal. Additionally, the invention may comprise a receiver, in that the RF signal 223 may comprise a received signal, the amplifier 205 may comprise an amplifier for a received signal, such as an LNA for example, and the mixer 203 may be enabled to down-convert a received signal to baseband. Whether the signal to be undersampled is a signal to be transmitted or one that has been received, the undersampling process may be identical.

Figure 3:
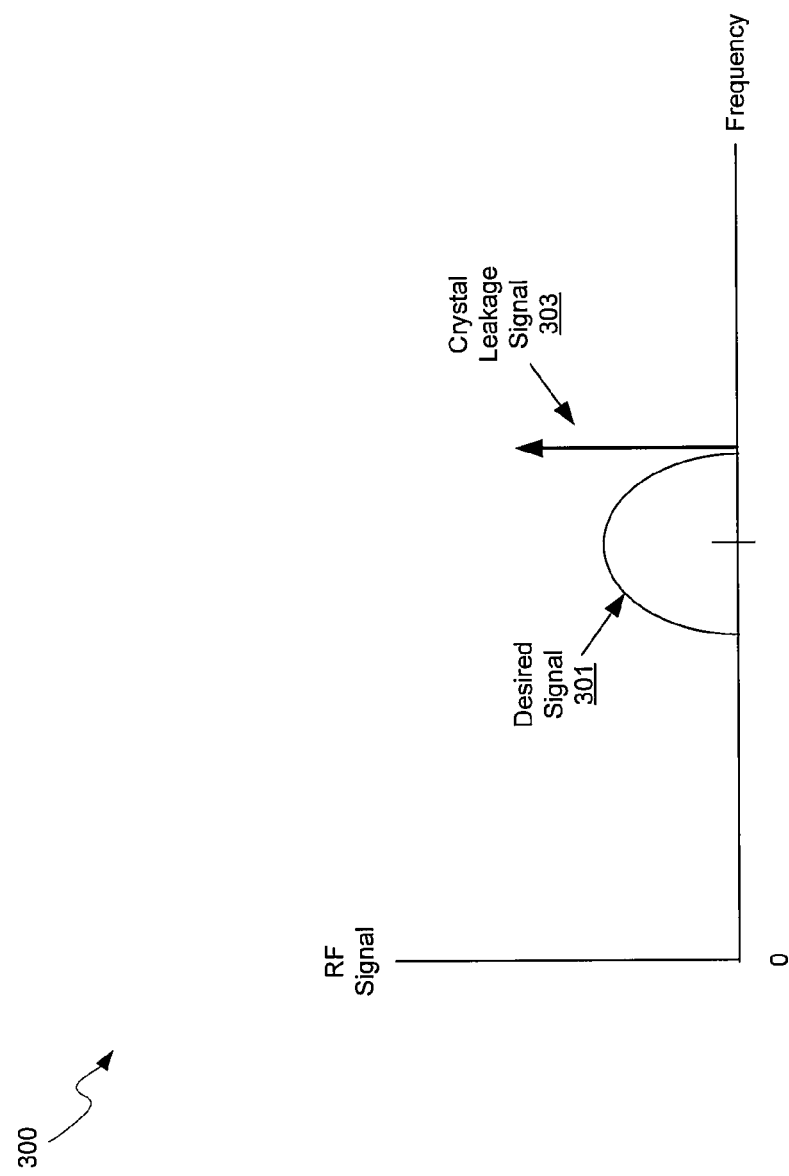
FIG. 3 is a block diagram illustrating an exemplary RF signal spectrum, in accordance with an embodiment of the invention.

FIG. 3 is a block diagram illustrating an exemplary RF signal spectrum, in accordance with an embodiment of the invention. Referring to FIG. 3 there is shown an RF spectrum 300 comprising a desired signal 301 and a crystal leakage signal 303. The RF spectrum 300 may be substantially similar to the RF signal 223, described with respect to FIG. 2. The crystal leakage signal 303 may be different than a blocker signal, which may comprise an interfering signal received by the wireless system. The crystal leakage signal 303 may comprise a signal leaking through the system that may be generated by a clock signal utilized by the circuitry in the wireless system. Thus, the leakage signal 303 may comprise the clock signal itself, a 13 MHz clock signal, for example, or a harmonic of the clock signal. To avoid interference from a leakage signal, the RF spectrum 300 may be undersampled at integer sub-harmonics of any clock signal that may cause leakage. This may be performed on a signal to be transmitted or on a received signal, which may comprise leakage signals from clock signals in the wireless system.

Undersampling a signal at an integer sub-harmonic frequency may result in a DC signal corresponding to the leakage signal. Signals that are not harmonics of the undersampling frequency may have non-zero frequency signals in the baseband after subsampling, so that they may be filtered out with a low pass filter, such as the LPF 215 described with respect to FIG. 2. In this manner, the DC voltage may be measured and may correspond to the magnitude of the leakage signal. This is described further with respect to FIG. 4.

Figure 4:
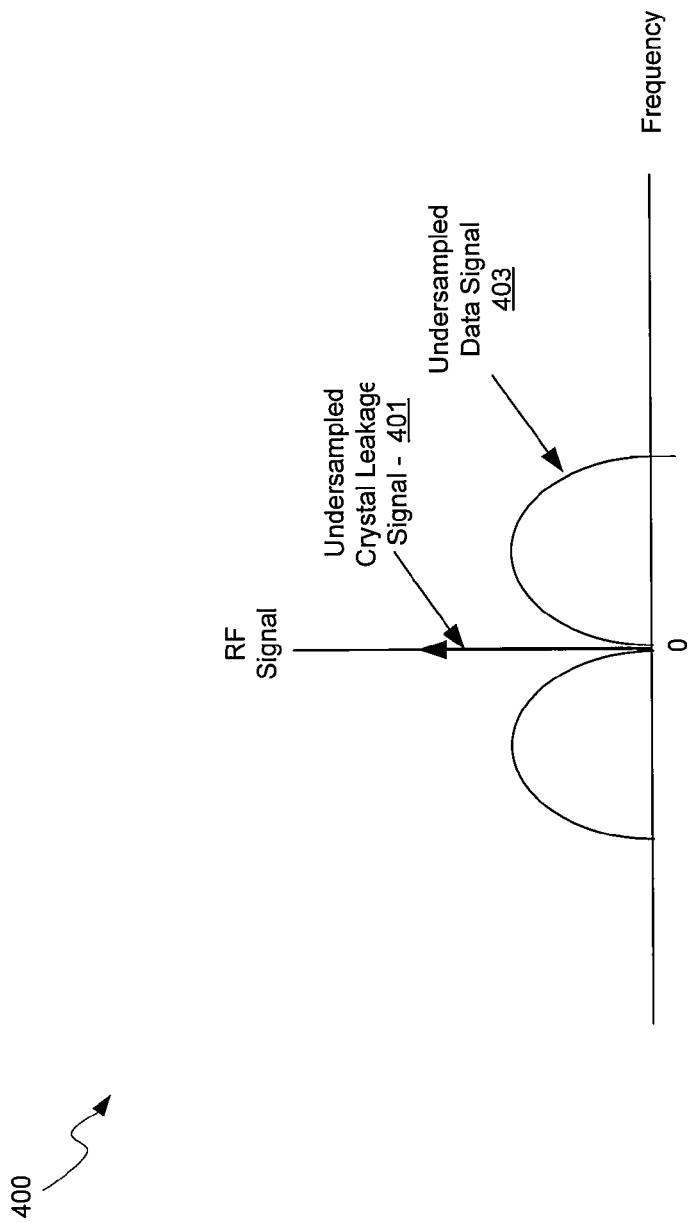
FIG. 4 is a block diagram illustrating an exemplary undersampled RF signal spectrum, in accordance with an embodiment of the invention.

FIG. 4 is a block diagram illustrating an exemplary undersampled RF signal spectrum, in accordance with an embodiment of the invention. Referring to FIG. 4, there is shown an undersampled frequency spectrum 400 comprising an undersampled crystal leakage signal 401 and an undersampled data signal 403. The undersampled data signal 403 may be removed utilizing a low pass filter, such as the LPF 215 described with respect to FIG. 2, resulting in a DC output signal, the undersampled crystal leakage signal 401. By adjusting the phase and amplitude of the clock signal that may be the source of the leakage signal, the DC output voltage may be minimized and/or eliminated, indicating a minimized and/or eliminated leakage signal.

Figure 5:
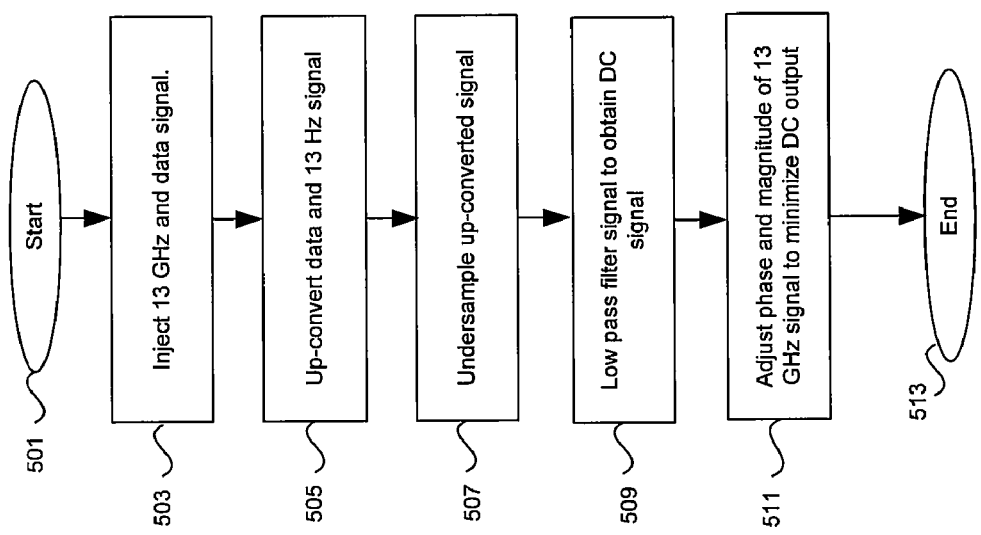
FIG. 5 is a flow diagram illustrating an exemplary transmitter leakage signal cancellation process, in accordance with an embodiment of the invention.

FIG. 5 is a flow diagram illustrating an exemplary transmitter leakage signal cancellation process, in accordance with an embodiment of the invention. Referring to FIG. 5, in step 503, after start step 501, a data signal and a clock signal may be processed by a signal processor. In step 505, the processed signal may be up-converted to RF generating an output signal that may be transmitted. In step 507, the up-converted signal may be undersampled at an integer sub-harmonic of the clock signal frequency. The undersampled signal may be low pass filtered in step 509, to result in a DC output signal. The phase and amplitude of the clock may then be adjusted in step 511 to minimize and/or eliminate the DC signal, which may minimize and/or eliminate the leakage signal, followed by end step 513.

Figure 6:
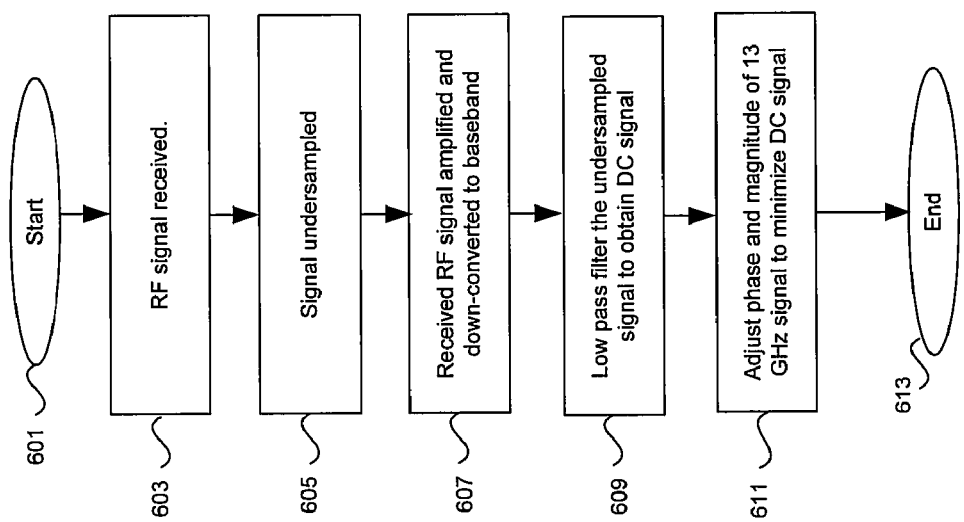
FIG. 6 is a flow diagram illustrating an exemplary receiver leakage signal cancellation process, in accordance with an embodiment of the invention.

FIG. 6 is a flow diagram illustrating an exemplary receiver leakage signal cancellation process, in accordance with an embodiment of the invention. Referring to FIG. 6, in step 603, after start step 601, an RF signal may be received. In step 605, the received signal may be undersampled at an integer sub-harmonic of the leakage signal. In step 607, the received RF signal may be amplified and down-converted to baseband. The undersampled signal may be low pass filtered in step 609, to result in a DC output signal. The phase and amplitude of the clock signal may then be adjusted in step 611 to minimize and/or eliminate the DC signal, which may minimize and/or eliminate the leakage signal, followed by end step 613.

In an embodiment of the invention, a method and system are disclosed for undersampling a composite signal comprising a desired signal 219 and one or more leakage signals due to one or more clock signals 217. One or more measured DC signals 221 generated by each of the undersampled signals may be reduced by adjusting a phase and/or an amplitude of the one or more clock signals 217. The undersampling may be performed at one or more of the clock signals 217, or at integer sub-harmonics of the clock signals 217. The composite signal may comprise a signal received by a wireless system or a signal to be transmitted by the wireless system. The undersampled signals may be low-pass filtered. The desired signal 219 may comprise in-phase and quadrature signals or a polar signal. The undersampling may be performed by one or more sample and hold circuits 209 and the clock signals 217 may be generated utilizing one or more crystal oscillators.

Certain embodiments of the invention may comprise a machine-readable storage having stored thereon, a computer program having at least one code section for utilizing undersampling for crystal leakage cancellation, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication in a wireless system, said method comprising:
   undersampling a composite signal comprising a desired signal and one or more leakage signals, said one or more leakage signals due to one or more clock signals; and
   adjusting one or both of a phase and an amplitude of said one or more clock signals, to reduce one or more measured DC signals generated by each of said undersampled signals.

2. The method according to claim 1, comprising undersampling said composite signal at one or more frequencies that are equal to one or more of said one or more clock signals.

3. The method according to claim 1, comprising undersampling said composite signal at one or more frequencies that are integer sub-harmonics of said one or more clock signals.

4. The method according to claim 1, wherein said composite signal is a signal received by said wireless system.

5. The method according to claim 1, wherein said composite signal is a signal to be transmitted by said wireless system.

6. The method according to claim 1, comprising low-pass filtering each of said undersampled signals.

7. The method according to claim 1, wherein said desired signal comprises in-phase and quadrature signals.

8. The method according to claim 1, comprising undersampling said composite signal utilizing one or more sample and hold circuits.

9. The method according to claim 1, comprising generating one or more of said one or more clock signals utilizing one or more crystal oscillators.

10. A system for wireless communication, the system comprising:
    one or more circuits in a wireless system that enable undersampling a composite signal comprising a desired signal and one or more leakage signals, said one or more leakage signals due to one or more clock signals; and
    said one or more circuits enables adjustment of one or both of a phase and an amplitude of said one or more clock signals, to reduce one or more measured DC signals generated by each of said undersampled signals.

11. The system according to claim 10, wherein said one or more circuits enable undersampling of said composite signal at one or more frequencies that are equal to one or more of said one or more clock signals.

12. The system according to claim 10, wherein said one or more circuits enable undersampling of said composite signal at one or more frequencies that are integer sub-harmonics of said one or more clock signals.

13. The system according to claim 10, wherein said composite signal is a signal received by said wireless system.

14. The system according to claim 10, wherein said composite signal is a signal to be transmitted by said wireless system.

15. The system according to claim 10, wherein said one or more circuits enable low-pass filtering of each of said undersampled signals.

16. The system according to claim 10, wherein said desired signal comprises in-phase and quadrature signals.

17. The system according to claim 10, wherein said one or more circuits enable undersampling of said composite signal utilizing one or more sample and hold circuits.

18. The system according to claim 10, wherein said one or more circuits enable generation of one or more of said one or more clock signals utilizing one or more crystal oscillators.

19. A device for wireless communication, said device comprising:
    a circuit that operates to undersample a composite signal comprising a desired signal and a leakage signal, said leakage signal being related to a clock signal; and
    a processor that operates to adjust one or both of a phase and an amplitude of said clock signal according to said undersampled composite signal.

20. The device according to claim 19, wherein the undersampled signal is an analog signal.

* * * * *